US010047433B2

(12) United States Patent
Ohashi et al.

(10) Patent No.: US 10,047,433 B2
(45) **Date of Patent: *Aug. 14, 2018**

(54) TUNGSTEN SINTERED COMPACT SPUTTERING TARGET AND TUNGSTEN FILM FORMED USING SAME TARGET

(71) Applicant: JX Nippon Mining & Metals Corporation, Tokyo (JP)

(72) Inventors: Kazumasa Ohashi, Ibaraki (JP); Takeo Okabe, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 421 days.

This patent is subject to a terminal disclaimer.

(21) Appl. No.: 14/381,664

(22) PCT Filed: Feb. 27, 2013

(86) PCT No.: PCT/JP2013/055035

§ 371 (c)(1),
(2) Date: Aug. 28, 2014

(87) PCT Pub. No.: WO2013/129434

PCT Pub. Date: Sep. 6, 2013

(65) Prior Publication Data

US 2015/0023837 A1 Jan. 22, 2015

(30) Foreign Application Priority Data

Mar. 2, 2012 (JP) ................................ 2012-047162

(51) Int. Cl.

| | |
|---|---|
| ***C22C 27/04*** | (2006.01) |
| ***C22C 1/04*** | (2006.01) |
| ***C23C 14/14*** | (2006.01) |
| ***B22F 3/14*** | (2006.01) |
| ***H01J 37/34*** | (2006.01) |
| ***C23C 14/34*** | (2006.01) |
| ***C23C 14/16*** | (2006.01) |
| ***B22F 7/00*** | (2006.01) |
| ***B22F 7/04*** | (2006.01) |
| *B22F 3/15* | (2006.01) |

(52) U.S. Cl.

CPC ........... *C23C 14/3414* (2013.01); *B22F 3/14* (2013.01); *B22F 7/008* (2013.01); *B22F 7/04* (2013.01); *C22C 1/045* (2013.01); *C22C 27/04* (2013.01); *C23C 14/14* (2013.01); *C23C 14/165* (2013.01); *H01J 37/3426* (2013.01); *B22F 3/15* (2013.01)

(58) Field of Classification Search

CPC ........................... C23C 14/3414; C23C 14/14

See application file for complete search history.

(56) References Cited

U.S. PATENT DOCUMENTS

| | | | |
|---|---|---|---|
| 6,582,535 | B1 | 6/2003 | Suzuki et al. |
| 7,635,865 | B2 | 12/2009 | Suzawa et al. |
| 7,666,718 | B2 | 2/2010 | Suzawa et al. |
| 8,764,877 | B2 | 7/2014 | Sato et al. |
| 9,045,831 | B2 | 6/2015 | Suzawa et al. |
| 2011/0094879 | A1 | 4/2011 | Suzuki et al. |
| 2015/0303040 | A1 | 10/2015 | Kaminaga et al. |
| 2015/0357170 | A1 | 12/2015 | Ohashi et al. |
| 2016/0148790 | A1 | 5/2016 | Suzuki et al. |

FOREIGN PATENT DOCUMENTS

| | | | |
|---|---|---|---|
| JP | H05-093267 | A | 4/1993 |
| JP | H07-076771 | A | 3/1995 |
| JP | 10-330924 | A | 12/1998 |
| JP | 2000-256836 | A | 9/2000 |
| JP | 2001-295036 | A | 10/2001 |
| JP | 2001-335923 | A | 12/2001 |
| JP | 2003-226964 | A | 8/2003 |
| JP | 2005-113190 | A | 4/2005 |
| JP | 2005-171389 | A | 6/2005 |
| JP | 2007-314883 | A | 12/2007 |
| JP | 2011-214067 | A | 10/2011 |

OTHER PUBLICATIONS

Machine translation of JP 2001295036, 2001.*

* cited by examiner

*Primary Examiner* — Deborah Yee
(74) *Attorney, Agent, or Firm* — Howson & Howson LLP

(57) ABSTRACT

Provided is a tungsten sintered compact sputtering target, wherein the purity of the tungsten is 5N (99.999%) or more, and the content of impurity carbon in the tungsten is 5 wtppm or less. An object of the present invention is to decrease the specific resistance of a tungsten film sputter-deposited by using a tungsten sintered compact sputtering target by reducing a carbon content in the tungsten target.

7 Claims, No Drawings

TUNGSTEN SINTERED COMPACT SPUTTERING TARGET AND TUNGSTEN FILM FORMED USING SAME TARGET

BACKGROUND

The present invention relates to a tungsten sintered compact target used for forming a gate electrode or a wiring material in IC, LSI and the like by the sputtering method, and also relates to a tungsten film deposited using the above target.

In recent years, use of a material having lower electric resistance as an electrode material and a wiring material has been explored along with the higher integration in VLSIs. In view of this, highly-pure tungsten having low electric resistance, which is thermally and chemically stable, is used as an electrode material or a wiring material.

Electrode materials and wiring materials for VLSIs are generally manufactured by the sputtering method or the CVD method. The sputtering method is more widely used than the CVD method because the structure and operation of the sputtering equipment is relatively simple, and deposition by the sputtering method is easy and less expensive.

High purity and high density are required for a tungsten target. In recent years, a material having low electric resistance is further required for a film formed by depositing an electrode material and a wiring material for VLSI by sputtering using a tungsten target.

As described below, a tungsten sintered compact target can have improved purity and higher density, and solutions for achieving them have been disclosed. However, conditions required to lower electric resistance have been unknown, and thus studies and developments of that have not been undertaken.

When manufacturing a conventional tungsten sintered compact sputtering target, pressure sintering is commonly performed using a graphite die. For example, Patent Literatures 1, 2 and 3 as described below can be cited. In this case, C may inevitably be present in tungsten as an impurity. Further, Patent Literatures 4 and 5 describe schemes to achieve higher density although types of dies are not particularly specified therein.

These Patent Literatures are primarily intended to increase the density of a tungsten target, but not intended to reduce electric resistance.

In addition, Patent Literature 6 describes a tungsten sintered compact target having a reduced amount of C. More specifically it discloses a method of reducing specific resistance by decreasing a carbon content to 50 ppm or less (the smallest C content is 19 ppm as shown in Example therein).

Further, Patent Literature 7 discloses a technology for reducing a C content in a metal material in order to obtain a uniform film and to decrease the frequency of dust generation (the smallest C content is 10 ppm as shown in Example therein).

Moreover, Patent Literature 8 discloses a technology for reducing a C content to 30 ppm or less (the smallest C content is 6 ppm as shown in Example therein) in order to prepare a highly pure and highly densified tungsten sintered compact target.

Some of the above Patent Literatures envision a tungsten sintered compact target in which a carbon content is reduced to decrease specific resistance. However the reduction conditions have not been sufficient enough to produce a significant effect.

Patent Literature 1: Japanese Patent No. 3086447
Patent Literature 2: Japanese Patent No. 3721014
Patent Literature 3: WO02009/147900
Patent Literature 4: Japanese Patent Laid-Open No. 2005-171389
Patent Literature 5: Japanese Patent Laid-Open No. 2007-314883
Patent Literature 6: Japanese Patent Laid-Open No. H05-093267
Patent Literature 7: Japanese Patent Laid-Open No. 2001-335923
Patent Literature 8: Japanese Patent Laid-Open No. H07-076771

SUMMARY

In view of the above, an object of the present invention is to provide a tungsten sintered compact target by using which electric resistance of a tungsten film formed can be stably decreased.

In order to achieve the above object, the present inventors provide the following inventions.

1) A tungsten sintered compact sputtering target, wherein the purity of the tungsten is 5N (99.999%) or more, and the content of impurity carbon in the tungsten is 5 wtppm or less.
2) The tungsten sintered compact sputtering target according to 1), wherein the content of impurity carbon is 3 wtppm or less.
3) The tungsten sintered compact sputtering target according to 2), wherein the content of impurity carbon is 1 wtppm or less.
4) The tungsten sintered compact sputtering target according to any one of 1) to 3), wherein the relative density of the target is 98% or more.
5) A method of manufacturing a tungsten sintered compact sputtering target, the method comprising: when a graphite die is filled with a tungsten powder to perform hot press, placing one or more metal foils selected from titanium (Ti), tantalum (Ta) and zirconium (Zr) in the die; then filling the die with the tungsten powder; further placing the metal foil(s) thereover; and then performing hot press (HP).
6) The method of manufacturing a tungsten sintered compact sputtering target according to 5), comprising: placing the metal foil(s) so that the metal foil(s) also reach a side surface of the sintered compact; and then performing hot press (HP).
7) A method of manufacturing a tungsten sintered compact sputtering target, the method comprising: when a graphite die is filled with a tungsten powder to perform hot press, placing one or more metal foils selected from titanium (Ti), tantalum (Ta) and zirconium (Zr) in the die; filling the die with the tungsten powder; wrapping the tungsten powder with the metal foil(s); and then performing hot press (HP).
8) A tungsten film deposited on a substrate by using the tungsten sintered compact sputtering target according to any one of 1) to 4) above, wherein the specific resistance of the film is 12.3 $\mu\Omega\cdot cm$ or less.

Advantageously, electric resistance can be stably decreased for a tungsten film deposited by using a tungsten sintered compact sputtering target in which the purity of the tungsten is 5N (99.999%) or more, and the content of impurity carbon in the tungsten is 5 wtppm or less.

DETAILED DESCRIPTION

A tungsten sintered compact sputtering target according to the present invention has a purity of tungsten of 5N (99.999%) or more, and has an impurity carbon content in the tungsten of 5 wtppm or less, or 3 wtppm or less, or even 1 wtppm or less.

Conventionally, a tungsten sintered compact sputtering target is manufactured by filling a carbon die with a tungsten powder having a mean grain diameter of about 1 μm, and performing hot press at about 1800° C. followed by performing HIP treatment for about 5 hours at 1850° C. In this case, a mean grain diameter of 20 to 30 μm, and a relative density of 99% can be achieved.

However, the resulting sintered compact target will contain a large amount of carbon as an impurity because it is manufactured in a carbon die. In this case, a trend has been observed that the larger is a carbon content, the higher is the specific resistance of a tungsten film after sputter deposition. Under the circumstances, however, even when a carbon content was reduced to 10 ppm or less, and even down to 6 to 7 ppm, decrease in specific resistance could not be achieved.

In order to overcome the above problem, extensive studies to achieve a carbon content of 5 ppm or less by using an approach in which a contact area with carbon is minimized as small as possible has been conducted. Reducing a carbon content has been found to be remarkably effective, allowing the specific resistance of a tungsten film after deposition to be 12.3 μΩcm or less.

To achieve this, a tungsten sintered compact sputtering target may be manufactured by, when a graphite die is filled with a tungsten powder to perform hot press, placing one or more metal foils selected from titanium (Ti), tantalum (Ta) and zirconium (Zr) in the die; filling the die with the tungsten powder; wrapping the tungsten powder with the metal foil(s); and then performing hot press (HP).

In the case described above, since the whole surfaces of a target are covered with a foil/foils of titanium, tantalum and/or zirconium during hot press (HP), a contact area with carbon can be minimized, and thereby an effect of significantly reducing contamination of the tungsten target with carbon can be obtained.

Any foil(s) of titanium, tantalum and zirconium may be selected to be placed over and beneath a raw material for a sintered compact when sintering is performed. Any of the foils may be used. Further, two or more sheets of the foil(s) may be layered.

A method of reducing a carbon content is not necessary limited to those described above as long as separation is achieved to prevent a direct contact with a graphite die. For example, the metal foil(s) may be placed on the bottom of a die, which is then filled with a tungsten powder. The metal foil(s) may further be placed over the tungsten powder filled.

When metal foils are placed on the top surface and the bottom surface as described above, there is still a possibility of carbon contamination from a side surface. However, this will not be a problem, since an amount of contaminating carbon from a side surface is negligibly small in view of a tungsten target to be sintered being thin and the area comparison with the top and bottom surfaces.

Nonetheless, if possible, it is preferred that a metal foil/foils is/are also placed on a side surface to wrap it up. In particular, this is preferred when the area of a side surface is large.

When sintering, hot press (HP) at a temperature exceeding 1500° C. is effective. After performing hot press, HIP treatment may also be performed at a temperature exceeding 1600° C. to further increase a density.

A tungsten sintered compact sputtering target may also be provided which has a relative density of 99% or more, and even 99.5% or more. An improved density is more preferred because it may increase the strength of a target.

The specific resistance can be decreased for a tungsten film deposited with a tungsten target in this way. At the same time, the target can have a uniform structure in the radial and thickness directions of the target, and sufficient strength enough to prevent a problem such as cracking during operation or during use. Therefore, the yield in manufacturing of targets can be improved.

Because chances can be reduced for carbon contamination as described above, the content of impurity carbon can be reduced to 5 wtppm or less, 3 wtppm or less, and even 1 wtppm or less. As a result, an excellent effect can be obtained that decreased resistance of a tungsten film can be achieved.

Further, such reduction in oxygen and carbon contents can provide a uniform structure, and also create an effect of suppressing crack and fracture generation in a target. These tungsten sintered compact sputtering targets can be used for the film deposition on a substrate, and thus useful for manufacturing a semiconductor device.

As described above, the sputtering target according to the present invention can have improved density. As a result, reduced voids and micronized crystal grains can allow a sputtering surface of the target to be uniform and smooth. Therefore, particles and nodules during sputtering can be reduced, and a life time of the target can also be extended. Further, variation in quality will be small, leading to improved productivity.

Further, because titanium, tantalum and zirconium have a higher ability to bind oxygen as compared to tungsten, they deprive a tungsten raw material powder of oxygen during sintering to reduce impurity oxygen therein. An oxygen content can be reduced to 100 wtppm or less.

Oxygen forms oxides when reacting with impurities contained in tungsten. Therefore, reduced oxygen is preferred. Further, the gas component of oxygen also reacts with tungsten to form oxides in a similar fashion. They may enter into a wiring material for LSI during sputter deposition, resulting in a decreased function of a tungsten wiring. Therefore, they should be as few as possible.

EXAMPLES

In the following, the present invention will be described with reference to Examples and Comparative Examples. Note that Examples are presented for merely illustrative purposes, and the present invention shall in no way be limited thereby. That is, the present invention is limited only by the claims, and shall encompass various modifications other than those in Examples included in the present invention.

Example 1

A Ti foil having a thickness of 0.5 mm was pre-placed in a carbon die. Then the die was filled with a tungsten powder having a purity of 99.999% and a mean grain diameter of 1.0 μm. This powder was then wrapped with the above metal foil.

Next, after sealed with upper punch and lower punch, pressure was applied to the die at 210 kgf/cm$^2$, and heated to 1200° C. by external heating, and then maintained for 6 hours to perform hot press. The highest temperature is 1600° C.×2 hours. The shape after the hot press is ϕ (diameter) 456 mm×10 mm t (thickness).

After this HP, HIP treatment was performed at 1750° C. for 5 hours. The resulting tungsten sintered compact had a relative density of 99.0%, a mean grain diameter of 15.1 μm, a carbon content of 5 wtppm and an oxygen content of 40 wtppm. The results are shown in Table 1. These results all satisfied the conditions according to the present invention.

TABLE 1

| | Placed material | HP temperature [° C.] | HIP temperature [° C.] | Relative density [%] | Mean grain diameter [μm] | Carbon content [wtppm] | Oxygen content [wtppm] |
|---|---|---|---|---|---|---|---|
| Example 1 | Ti foil | 1600 | 1750 | 99.0 | 15.1 | 5 | 40 |
| Example 2 | Ti foil | 1570 | 1850 | 99.0 | 32.1 | 3 | 60 |
| Example 3 | Ti foil | 1570 | 1570 | 99.0 | 39.7 | <1 | 50 |
| Example 4 | Ti foil | 1570 | 1600 | 99.2 | 26.9 | <1 | 30 |
| Example 5 | Ta foil | 1570 | 1570 | 99.0 | 27.9 | <1 | 40 |
| Example 6 | Ta foil | 1570 | 1850 | 99.3 | 212.3 | <1 | 60 |
| Example 7 | Ta foil | 1800 | 1570 | 99.0 | 30.8 | <1 | <10 |
| Example 8 | Ta foil | 1800 | 1850 | 99.1 | 173.0 | <1 | 30 |
| Example 9 | Zr foil | 1650 | 1700 | 99.2 | 29.3 | <1 | 40 |
| Comparative Example 1 | Carbon sheet | 1800 | 1850 | 99.2 | 22.5 | 30 | 20 |
| Comparative Example 2 | Ti foil | 1400 | 1570 | 99.0 | 69.7 | 10 | 610 |
| Comparative Example 3 | Ti foil | 1500 | 1570 | 94.0 | 12.1 | 5 | 220 |
| Comparative Example 4 | Mo foil | 1570 | 1600 | 91.2 | 19.3 | 5 | 240 |

Example 2

A Ti foil having a thickness of 0.5 mm was pre-placed in a carbon die. Then the die was filled with a tungsten powder having a purity of 99.999% and a mean grain diameter of 1.0 μm. This powder was then wrapped with the above metal foil.

Next, after sealed with upper punch and lower punch, pressure was applied to the die at 210 kgf/cm$^2$, and heated to 1200° C. by external heating, and then maintained for 4 hours to perform hot press. The highest temperature is 1570° C.×2 hours. The shape after the hot press is ϕ (diameter) 456 mm×10 mm t (thickness).

After this HP, HIP treatment was performed at 1850° C. for 5 hours. The resulting tungsten sintered compact had a relative density of 99.0%, a mean grain diameter of 32.1 μm, a carbon content of 3 wtppm and an oxygen content of 60 wtppm. The results are shown in Table 1. These results all satisfied the conditions according to the present invention.

Example 3

A Ti foil having a thickness of 0.5 mm was pre-placed in a carbon die. Then the die was filled with a tungsten powder having a purity of 99.999% and a mean grain diameter of 1.0 μm. This powder was then wrapped with the above metal foil.

Next, after sealed with upper punch and lower punch, pressure was applied to the die at 210 kgf/cm$^2$, and heated to 1200° C. by external heating, and then maintained for 4 hours to perform hot press. The highest temperature is 1570° C.×2 hours. The shape after the hot press is ϕ (diameter) 456 mm×10 mm t (thickness).

After this HP, HIP treatment was performed at 1570° C. for 5 hours. The resulting tungsten sintered compact had a relative density of 99.0%, a mean grain diameter of 39.7 μm, a carbon content of less than 1 wtppm and an oxygen content of 50 wtppm. The results are shown in Table 1. These results all satisfied the conditions according to the present invention.

Example 4

A Ti foil having a thickness of 0.5 mm was pre-placed in a carbon die. Then the die was filled with a tungsten powder having a purity of 99.999% and a mean grain diameter of 1.0 μm. This powder was then wrapped with the above metal foil.

Next, after sealed with upper punch and lower punch, pressure was applied to the die at 210 kgf/cm$^2$, and heated to 1200° C. by external heating, and then maintained for 2 hours to perform hot press. The highest temperature is 1570° C.×2 hours. The shape after the hot press is ϕ (diameter) 456 mm×10 mm t (thickness).

After this HP, HIP treatment was performed at 1600° C. for 5 hours. The resulting tungsten sintered compact had a relative density of 99.2%, a mean grain diameter of 26.9 μm, a carbon content of less than 1 wtppm and an oxygen content of 30 wtppm. The results are shown in Table 1. These results all satisfied the conditions according to the present invention.

Example 5

A Ta foil having a thickness of 0.2 mm was pre-placed in a carbon die. Then the die was filled with a tungsten powder having a purity of 99.999% and a mean grain diameter of 1.0 μm. This powder was then wrapped with the above metal foil.

Next, after sealed with upper punch and lower punch, pressure was applied to the die at 210 kgf/cm$^2$, and heated to 1200° C. by external heating, and then maintained for 2 hours to perform hot press. The highest temperature is 1570° C.×2 hours. The shape after the hot press is ϕ (diameter) 456 mm ×10 mm t (thickness).

After this HP, HIP treatment was performed at 1570° C. for 5 hours. The resulting tungsten sintered compact had a relative density of 99.0%, a mean grain diameter of 27.9 μm, a carbon content of less than 1 wtppm and an oxygen content of 40 wtppm. The results are shown in Table 1. These results all satisfied the conditions according to the present invention.

Example 6

A Ta foil having a thickness of 0.2 mm was pre-placed in a carbon die.

Then the die was filled with a tungsten powder having a purity of 99.999% and a mean grain diameter of 1.0 μm. This powder was then wrapped with the above metal foil.

Next, after sealed with upper punch and lower punch, pressure was applied to the die at 210 kgf/cm$^2$, and heated to 1200° C. by external heating, and then maintained for 2 hours to perform hot press. The highest temperature is 1570° C.×2 hours. The shape after the hot press is ϕ (diameter) 456 mm×10 mm t (thickness).

After this HP, HIP treatment was performed at 1850° C. for 5 hours. The resulting tungsten sintered compact had a relative density of 99.3%, a mean grain diameter of 212.3 μm, a carbon content of less than 1 wtppm and an oxygen content of 60 wtppm. The results are shown in Table 1. These results all satisfied the conditions according to the present invention.

Example 7

A Ta foil having a thickness of 0.2 mm was pre-placed in a carbon die. Then the die was filled with a tungsten powder having a purity of 99.999% and a mean grain diameter of 1.0 μm. This powder was then wrapped with the above metal foil.

Next, after sealed with upper punch and lower punch, pressure was applied to the die at 210 kgf/cm$^2$, and heated to 1200° C. by external heating, and then maintained for 2 hours to perform hot press. The highest temperature is 1800° C.×2 hours. The shape after the hot press is ϕ (diameter) 456 mm×10 mm t (thickness).

After this HP, HIP treatment was performed at 1570° C. for 5 hours. The resulting tungsten sintered compact had a relative density of 99.0%, a mean grain diameter of 30.8 μm, a carbon content of less than 1 wtppm and an oxygen content of less than 10 wtppm. The results are shown in Table 1. These results all satisfied the conditions according to the present invention.

Example 8

A Ta foil having a thickness of 0.2 mm was pre-placed in a carbon die. Then the die was filled with a tungsten powder having a purity of 99.999% and a mean grain diameter of 1.0 μm. This powder was then wrapped with the above metal foil.

Next, after sealed with upper punch and lower punch, pressure was applied to the die at 210 kgf/cm$^2$, and heated to 1200° C. by external heating, and then maintained for 2 hours to perform hot press. The highest temperature is 1800° C.×2 hours. The shape after the hot press is ϕ (diameter) 456 mm×10 mm t (thickness).

After this HP, HIP treatment was performed at 1850° C. for 5 hours. The resulting tungsten sintered compact had a relative density of 99.1%, a mean grain diameter of 173.0 μm, a carbon content of less than 1 wtppm and an oxygen content of 30 wtppm. The results are shown in Table 1. These results all satisfied the conditions according to the present invention.

Example 9

A Zr foil having a thickness of 0.2 mm was pre-placed in a carbon die. Then the die was filled with a tungsten powder having a purity of 99.999% and a mean grain diameter of 1.0 μm. This powder was then wrapped with the above metal foil.

Next, after sealed with upper punch and lower punch, pressure was applied to the die at 210 kgf/cm$^2$, and heated to 1200° C. by external heating, and then maintained for 2 hours to perform hot press. The highest temperature is 1650° C.×2 hours. The shape after the hot press is ϕ (diameter) 456 mm×10 mm t (thickness).

After this HP, HIP treatment was performed at 1700° C. for 5 hours. The resulting tungsten sintered compact had a relative density of 99.2%, a mean grain diameter of 29.3 μm, a carbon content of less than 1 wtppm and an oxygen content of 40 wtppm. The results are shown in Table 1. These results all satisfied the conditions according to the present invention.

Comparative Example 1

A carbon sheet having a thickness of 0.2 mm was pre-placed in a carbon die. Then the die was filled with a tungsten powder having a purity of 99.999% and a mean grain diameter of 1.0 μm. This powder was then wrapped with the above carbon sheet.

Next, after sealed with upper punch and lower punch, pressure was applied to the die at 210 kgf/cm$^2$, and heated to 1200° C. by external heating, and then maintained for 2 hours to perform hot press. The highest temperature is 1800° C.×2 hours. The shape after the hot press is ϕ (diameter) 456 mm×10 mm t (thickness).

After this HP, HIP treatment was performed at 1850° C. for 5 hours. The resulting tungsten sintered compact had a relative density of 99.2%, a mean grain diameter of 22.5 μm, a carbon content of 30 wtppm and an oxygen content of 20 wtppm. The results are shown in Table 1. These results showed a high carbon content and did not satisfy the conditions according to the present invention.

Comparative Example 2

A Ti foil having a thickness of 0.5 mm was pre-placed in a carbon die. Then the die was filled with a tungsten powder having a purity of 99.999% and a mean grain diameter of 1.0 μm. This powder was then wrapped with the above metal foil.

Next, after sealed with upper punch and lower punch, pressure was applied to the die at 210 kgf/cm$^2$, and heated to 1200° C. by external heating, and then maintained for 2 hours to perform hot press. The highest temperature is 1400° C.×2 hours. The shape after the hot press is ϕ (diameter) 456 mm×10 mm t (thickness).

After this HP, HIP treatment was performed at 1570° C. for 5 hours. The resulting tungsten sintered compact had a relative density of 99.0%, a mean grain diameter of 69.7 μm, a carbon content of 10 wtppm and an oxygen content of 610 wtppm. The results are shown in Table 1. These results showed a high carbon content and did not satisfy the conditions according to the present invention.

Comparative Example 3

A Ti foil having a thickness of 0.5 mm was pre-placed in a carbon die. Then the die was filled with a tungsten powder having a purity of 99.999% and a mean grain diameter of 1.0 μm. This powder was then wrapped with the above metal foil.

Next, after sealed with upper punch and lower punch, pressure was applied to the die at 210 kgf/cm$^2$, and heated to 1200° C. by external heating, and then maintained for 2 hours to perform hot press. The highest temperature is 1500° C.×2 hours. The shape after the hot press is ϕ (diameter) 456 mm×10 mm t (thickness).

After this HP, HIP treatment was performed at 1570° C. for 5 hours. The resulting tungsten sintered compact had a relative density of 94.0%, a mean grain diameter of 12.1 μm, a carbon content of 5 wtppm and an oxygen content of 220 wtppm. The results are shown in Table 1. These results showed a low relative density and did not satisfy the conditions according to the present invention.

Comparative Example 4

A Mo foil having a thickness of 0.2 mm was pre-placed in a carbon die. Then the die was filled with a tungsten powder having a purity of 99.999% and a mean grain diameter of 1.0 μm. This powder was then wrapped with the above metal foil.

Next, after sealed with upper punch and lower punch, pressure was applied to the die at 210 kgf/cm$^2$, and heated to 1200° C. by external heating, and then maintained for 2 hours to perform hot press. The highest temperature is 1570° C.×2 hours. The shape after the hot press is ϕ (diameter) 456 mm×10 mm t (thickness).

After this HP, HIP treatment was performed at 1600° C. for 5 hours. The resulting tungsten sintered compact had a relative density of 91.2%, a mean grain diameter of 19.3 μm, a carbon content of 5 wtppm and an oxygen content of 240 wtppm. The results are shown in Table 1. These results showed a low relative density and did not satisfy the conditions according to the present invention.

Using the tungsten sintered compact targets prepared in Example 4 and

Comparative Example 1, tungsten films were formed on a silicon substrate by sputtering, and specific resistance was measured for the films. With a FIB device, the thickness of a film deposited to have a thickness of about 1000 Å was measured to compute a deposition rate. Further, the sheet resistance of a film having a thickness of 5000 Å was also measured.

Specific resistance was evaluated from these values. The results revealed that the specific resistance from Example 4 was 12.02 μΩ·cm, showing 3% decrease as compared with 12.38 μΩ·cm from Comparative Example 1. Note that this 3% decrease is very significant because it is very difficult to decrease the specific resistance of a tungsten film.

Advantageously, electric resistance can be stably decreased for a tungsten film formed by using a tungsten sintered compact sputtering target in which the purity of the tungsten is 5N (99.999%) or more and the content of impurity carbon in the tungsten is 5 wtppm or less. Therefore, the tungsten sintered compact sputtering target according to the present invention is useful for forming a LSI wiring film.

The invention claimed is:

1. A tungsten sintered compact sputtering target, consisting of tungsten of a purity of 5N (99.999%) or more, and having a content of impurity carbon in the tungsten of 3 wtppm or less.

2. The tungsten sintered compact sputtering target according to claim 1, wherein the content of impurity carbon is 1 wtppm or less.

3. The tungsten sintered compact sputtering target according to claim 2, wherein a relative density of the target is 98% or more.

4. A method of manufacturing a tungsten sintered compact sputtering target, the method comprising the steps of: placing one or more metal foils selected from titanium (Ti), tantalum (Ta) and zirconium (Zr) in a graphite die; then filling the die with a powder consisting of tungsten having a purity of 5N (99.999%) or more; further placing the metal foil(s) thereover; and then performing hot press (HP) to achieve a content of impurity carbon in the tungsten of 3 wtppm or less.

5. The method of manufacturing a tungsten sintered compact sputtering target according to claim 4, comprising: placing the metal foil(s) so that the metal foil(s) also reach a side surface of the sintered compact; and then performing hot press (HP).

6. A method of manufacturing a tungsten sintered compact sputtering target, the method comprising the steps of: placing one or more metal foils selected from titanium (Ti), tantalum (Ta) and zirconium (Zr) in a graphite die; filling the die with a powder consisting of tungsten having a purity of 5N (99.999%) or more; wrapping the powder with the metal foil(s); and then performing hot press (HP) to achieve a content of impurity carbon in the tungsten of 3 wtppm or less.

7. The tungsten sintered compact sputtering target according to claim 1, wherein the target has a relative density of 98% or more.

* * * * *